United States Patent
Suzuki et al.

(10) Patent No.: US 7,294,391 B2
(45) Date of Patent: Nov. 13, 2007

(54) CONTAMINATION RESISTANT FIBER SHEET

(75) Inventors: Masayuki Suzuki, Gamagori (JP); Toshikazu Suzuki, Gamagori (JP); Katsuhide Manabe, Gamagori (JP); Eigo Nakajima, Gamagori (JP)

(73) Assignee: Kabushiki Kaisha Suzutora, Gamagori-shi (JP)

( * ) Notice: Subject to any disclaimer, the term of this patent is extended or adjusted under 35 U.S.C. 154(b) by 600 days.

(21) Appl. No.: 10/339,479

(22) Filed: Jan. 9, 2003

(65) Prior Publication Data

US 2004/0137812 A1  Jul. 15, 2004

(51) Int. Cl.
*B32B 18/00* (2006.01)
*B32B 27/12* (2006.01)
*B32B 5/16* (2006.01)

(52) U.S. Cl. .......................... 428/210; 442/64; 442/66; 442/69; 442/76; 442/79; 442/82; 442/85; 442/88; 442/93

(58) Field of Classification Search ............... 977/6.1; 442/63, 64, 69, 165, 161, 167, 168, 169, 442/148; 428/210
See application file for complete search history.

(56) References Cited

U.S. PATENT DOCUMENTS

| | | | | |
|---|---|---|---|---|
| 3,283,708 | A | * | 11/1966 | Yackel ........................ 430/302 |
| 5,030,509 | A | * | 7/1991 | McCullough et al. ....... 442/117 |
| 6,105,500 | A | * | 8/2000 | Bhambra et al. ........... 101/455 |
| 6,579,599 | B1 | * | 6/2003 | Blum et al. .................. 428/196 |
| 2002/0182383 | A1 | * | 12/2002 | Phillips et al. .............. 428/199 |

OTHER PUBLICATIONS

Celanese Acetate Textile Glossary "web".*

* cited by examiner

*Primary Examiner*—Terrel Morris
*Assistant Examiner*—Matthew D. Matzek
(74) *Attorney, Agent, or Firm*—Day Pitney LLP

(57) ABSTRACT

A fiber sheet composed of knitted, woven, or non-woven fiber, which is resistant against contamination, and such contamination is easily washed off, and is durable, and suitable for use as materials to make curtains, tapestries, screens, flags, wallpaper, and sliding screen door (fusuma), for both indoor and outdoor environments. The fiber sheet is coated on its both sides of the fiber by ceramics composed of oxidized, nitrogenous, or carbonized forms of metals such as tin, titanium, aluminum, and other metals, forming a thin contamination resistant coating. Typically, the contamination resistant coating comprises $SiO_2$ or $SnO_2$ or a combination/mixture of the two substances, and such coating is hard and is superior in protection against contamination.

9 Claims, 3 Drawing Sheets

CONTAMINATION RESISTANT FIBER SHEET

BACKGROUND OF THE INVENTION

This invention relates to a contamination resistant fiber sheet and to a fiber sheet which is resistant to contaminants, such as soil, dirt, smoke, oily soiling and other particles, including airborne particles and substances, (collectively called "contamination" hereafter) have difficulty adhering to the fiber sheet and even if attached, such substances are easily removed therefrom.

The process of starching textiles is known to be effective in resisting contamination from adhering to the fibers forming the textile and is known to make the cleaning of the fibers of the contamination easier. However, this process is only effective against cotton textiles, and is not known to have positive effect for synthetic textile which is known to be lipophilic and also prone to discoloration. In addition, the textile requires starching every time the textile is washed.

The process of mixing silica and alumina as a colloid spread liquid and treating the textile by filling the tiny spaces between the fibers, flattening, and evening out the surface of the textile with the tiny colloid particles is also known but this process also is effective for cotton textile but not for synthetic fiber textile, and also poses an additional problem of durability.

On the other hand, the SR process is a known process for protecting synthetic fibers from contamination, however this process is only effective to a certain extent in preventing contamination, and especially oily contamination from adhering to the fiber sheet. Once contamination adheres, it is difficult to remove the contamination and is not able to prevent repeated contamination. In addition, SR process is not effective against preventing contamination from entering and spreading through the fibers.

SUMMARY OF THE INVENTION

Accordingly, it is an object of this invention to provide a contamination resistant fiber sheet to which contamination and other foreign particles are not easily attached.

It is another object of the present invention to provide a contamination resistant fiber sheet of knitted, woven, or non-woven fiber, which is resistant against contamination, and such contamination is also easily washed off.

It is still another object of the present invention to provide a contamination resistant fiber sheet which possess durability, suitable for use as materials to make curtains, tapestries, screens, flags, wallpaper, and sliding screen door (fusuma), for both indoor and outdoor use.

According to the first embodiment of the present invention, a fiber sheet is made of knitted, woven, or non-woven fiber and is characterized by a resistance against contamination, and such contamination is easily washed off the surface of the fiber and the fiber possesses durability, suitable for use as material to make curtains, tapestries, screens, flags, wallpaper, and Japanese style sliding screen doors (fusuma), for both indoor and outdoor use.

The fiber sheets with resistance against contamination is made from nylon fibers, polyester fibers, polyacrylonitrile fibers, aramid fibers, and other synthetic fibers, which are woven, knitted, or non-woven forming the fiber sheet. This fiber sheet may be plain without any design or may contain designs from dye processes or may have embossed designs. It is desirable to be used especially for curtain, tapestry, screen, flag, wallpaper, and Japanese style sliding screen door (fusuma).

For fiber sheet which is resistant to contamination, it is desirable to use synthetic fibers formed from filaments, and if knitted or woven, the fibers to be used are in the form of monofilament or multi-filament thread.

The present invention involves the fiber sheet being coated on both sides of the fiber sheet by ceramics composed of oxidized, nitrogenous, or carbonized forms of metals such as tin, titanium, aluminum, and other metals, forming a thin contamination resistant coating. This contamination resistant coating is hard and prevents contamination from entering into and between the fibers, making it difficult for the contamination to adhere, and also the surface of the coating is hydrophilic, water droplet forming, non-stick, and allows water to flow on the surface, making it more effective for rain water and/or washing water to wash off the contamination from the sheet.

The fiber sheet resistant to contamination is formed from filaments of synthetic fibers. The contamination resistant coating for the contamination resistant fiber sheet is fixed on the fiber sheet through a physical vapor depositing method, such as vacuum vapor deposit, spatter vapor deposit, or ion plating. The resultant coating is durable and is not easily removed during usage or during washing. When a spatter vapor deposit, or ion plating method is used, an especially durable coating is obtained.

When a spatter vapor deposit method is used and the fiber sheet is rapidly cooled from the back side of the fiber sheet, the coating becomes non-continuous, forming an amorphous structure, consisting of a tightly packed assembly of small needle-like structure, providing a touch to a person which is more like a fiber sheet than a coating or film, and when the fiber sheet is bent, the needle-like structure is not displaced, increasing the durability.

For fiber sheet resistant to contamination, it is desirable to have the contamination resistant coating to be composed of $SiO_2$ or $SnO_2$ or a combination/mixture of the two substances, as such a coating is hard and is superior in protection against contamination, and especially when the coating is composed of a mixture of the two substances, the hydrophilic property and anti-stick water droplet forming property is superior, water flows over the surface more easily, and removal of contamination is improved.

The contamination resistant coating, using tin or silicon board (plate) or sintered board (plate) of either substance as the target of the spattering equipment, and by spatter vapor depositing under an atmosphere containing very small amount of oxygen, the silicon or the tin is oxidized while it is stabilized onto the front of the fiber sheet. The thickness of the coating is to be between 1-1000 nm, and more desirably between 1-500 nm, but when under 1 nm, the effectiveness of the coating in resisting contamination is lost. On the other hand when the coating is thicker than 1000 nm, the feeling of the fiber sheet is lost and the transparency also declines and it becomes difficult to see the design of the fiber sheet, making use of the sheet less desirable.

The second embodiment of the present invention is characterized by a resistance against contamination and especially effective against oily contamination, the contamination is easily washed off the surface of the fiber, and the fiber sheets possesses durability, suitable for use as material to make curtains, tapestries, screens, flags, wallpaper, and Japanese style sliding screen door(fusuma), for both indoor and outdoor use.

According to the second embodiment of the present invention, the fiber sheets are made from nylon fibers, polyester fibers, polyacrylonitrile fibers, aramid fibers, and other synthetic fibers, which are woven, knitted, or non-woven forming the fiber sheet. This fiber sheet may be plain without any design or may contain designs from dye processes or may have embossed designs.

The second embodiment of the present invention, includes the fiber sheet being coated on both sides of the fiber with a transparent ceramic coating, in which the coating' main component is $SiO_2$. Prior to affixing this coating, the front side of the fiber sheet is to be coated with transparent fluoride resin coating as an undercoating. This undercoating is to provide breathable water resistant treatment to the fiber sheet and also provide resistance against contamination and oily soiling. This undercoating is made of fluoride resin which is composed of one the following or combination of the following substances: monofluoroethylene, difluoroethylene, trifluoroethylene, or tetrafluoroethylene. The fluoride resin is affixed to the fiber sheet through emulsification and is soaked and absorbed by the fiber or sprayed, and then dried, and then heat treated, which as a result an undercoating is formed over the fiber sheet. This undercoating fills up the small spaces and gaps between the fibers forming the fiber sheet. It is preferable for this undercoating to be between 0.1~10 nm, and when the undercoating is less than 0.1 nm in thickness, the effectiveness of the coating is lost, and when it is more than 10 nm in thickness, both transparency and the breathability is lost and it also becomes uneconomical as the cost of the coating increases.

In the second embodiment, the fiber sheet resistant to contamination is then coated by a transparent contamination resistant ceramic coating over the undercoating. The main component of the ceramic is to be $SiO_2$. This contamination resistant coating is hard and prevents contamination from entering into and between the fibers, making it difficult for the contamination to adhere, and also the surface of the outer coating is hydrophilic, water droplet forming, non-stick, and allows water to flow on the surface, making it more effective for rain water and/or washing water to wash off the contamination from the sheet. The main component of the ceramic coating of $SiO_2$ is hard but when compared to other ceramic substances, it is relative softer, and it matches and fits well with the fluoride undercoating. Additionally, it is transparent and the feel and touch of a fiber sheet is not lost from the coating.

In the second embodiment of the invention, the fiber sheet resistant to contamination is formed from filaments of synthetic fibers. The contamination resistant coating is fixed on the fiber sheet a through physical vapor depositing method, such as vacuum vapor deposit, spatter vapor deposit, or ion plating. The contamination resistant coating for the contamination resistant fiber sheet is fixed on the fiber sheet through a physical vapor depositing method, such as vacuum vapor deposit, spatter vapor deposit, or ion beam method. The resulting coating is durable and is not easily removed during usage or during washing. When spatter vapor deposit or ion beam method is used, an especially durable coating is obtained.

The second embodiment of the invention contains the fluoride resin undercoating between the fiber sheet and the outer ceramic coating. The durability and fixing of the outer layer is tremendously improved when compared to fixing the outer coating directly onto the fiber sheet, but the effectiveness in making it difficult for contamination to adhere to and if adhered to, easy to remove, is not affected.

When the spatter vapor deposit method is used and the fiber sheet is rapidly cooled from the back side of the fiber sheet in the second embodiment, the outer coating becomes non-continuous, forming an amorphous structure, consisting of a tightly packed assembly of small needle like structure, providing a touch to a persons which is more like a fiber sheet than a coating or film, and when the fiber sheet is bent, the needle-like structure is not displaced, increasing the durability.

In the second embodiment, it is desirable to have the contamination resistant coating with $SiO_2$ as its main component, however the coating may contain other ceramic substances to the extent that it does not interfere with the purpose of the invention. For example, having $SiO_2$ as its main component, $SnO_2$ may be included in the ceramic as a sub-component. When $SnO_2$ is included as sub-component, the vapor spatter depositing is more easily performed and since $SnO_2$ is hard, it increases the effectiveness against contamination. The outer ceramic coating composed of both $SiO_2$ and $SnO_2$ is also more hydrophilic, non-stick, water droplets forms on surface more easily, and water flows more easily over the surface, which as a result improves the resistance against contamination and oily soiling. When $SnO_2$ and/or $ZnO$ are subcomponents of the ceramic coating, the coating becomes effective against the attachment of contamination caused by static electricity because $ZnO$ possess electro-conductivity.

In the second embodiment, the outer ceramic coating for the contamination resistant fiber sheet uses silicon plate as target for the spattering device, and spattering is conducted in an atmosphere which contains smalls amount of oxygen. The silicon is oxidized and is fixed on the surface of fiber sheet. When $SiO_2$ and $SnO_2$ are used as for the ceramic coating, sintered plate made from a mixture of tin and silicon powder is used as target, and the coating is obtained conducting the spattering in similar method and atmosphere. When $SiO_2$, $SnO_2$, and $ZnO$ are used for ceramic coating, sintered plates of silicon, tin, and zinc are to be used as targets, or the sintered plates of silicon and tin and zinc plate may be used as targets placed in mixed order, and by spattering as described above.

The thickness of the outer coating of between 1~200 nm is desirable in the second embodiment, and when the thickness is under 1 nm, effectiveness as an outer coating is lost and durability becomes also poor, and on the other hand, when the thickness is over 200 nm, the feel of the fiber sheet is lost, transparency decreases thereby making it difficult to see the design of the fiber sheet, and becomes less desirable.

DESCRIPTION OF PREFERRED EMBODIMENTS

Figure 1:
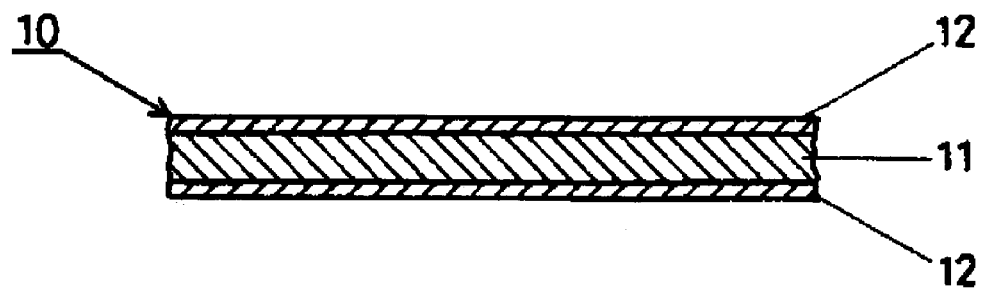
FIG. 1 is a cross sectional view of a contamination resistant fiber sheet according to a first embodiment of the present invention.

Referring to FIG. 1, a contamination resistant fiber sheet according to a first embodiment of the present invention is shown as 10. The contamination resistant fiber sheet 10 is made of polyester or other synthetic fibers forming multi-filament thread which is used for both warp and weft and woven into material suitable for curtain or other items, for indoor and outdoor use. According to the first embodiment of the present invention, the contamination resistant fiber sheet, comprises the fiber sheet 11. The fiber sheet 11 on both the front and the back side is coated by contamination resistant coating 12. The above described fiber sheet 11 includes on its front side designs, which are woven in or dyed. Also the contamination resistant coating 12 is made of ceramic substance, such as $SiO_2$ or $SnO_2$ or the mixture of the two, with a thickness of 1-500 nm.

Figure 2:
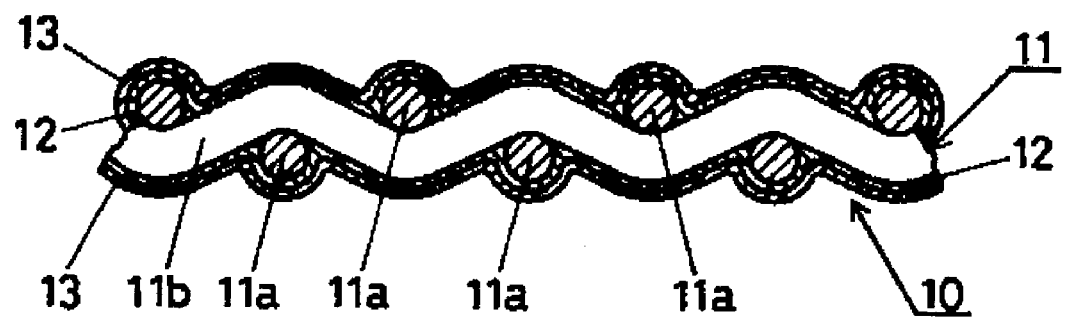
FIG. 2 is a cross sectional view of a contamination resistant sheet according to a second embodiment of the present invention.

Referring to FIG. 2, a contamination resistant fiber sheet according to a second embodiment of the present invention is shown as 10. The contamination resistant fiber sheet 10 is made of warp 11a and weft 11b, both made of polyester or other synthetic fiber forming multi-filament thread or spinning thread, which is woven into curtain or other items, for indoor and outdoor. The contamination resistant fiber sheet 10 comprises of warp 11a and weft 11b an undercoating 12 and an outer coating 13.

The contamination resistant fiber sheet 11 is woven, refined and set, it is then dyed, dried and heat set. Then the fiber sheet 11 is dipped in an emulsion including fine powder of tetra-fluoro-ethylene resin and initial stage condensed melanin resin, and the it is squeezed using mangle, dried, and heat set, forming the undercoating 12. The thickness of the undercoating is to be at a thickness which does not affect the breathability of the fiber sheet 11, which is approximately between 0.1~10 μm.

The above described contamination resistant coating 12 in the first embodiment and the outer coating in the second are desirably fixed on the fiber sheet 11 through a spatter vapor deposit method. For the contamination resistant fiber sheet in the second embodiment, the outer coating 13, made from $SiO_2$ as the main component is fixed at a thickness between 1~200 nm.

The contamination resistant fiber sheet 11 in first embodiment or the contamination resistant fiber sheet 11, in the second embodiment fixed with the undercoating 12, is spread out and placed inside a closed chamber, and against the front surface, an anode and a target are placed, which the anode is to be located between the fiber sheet 11 and the target.

The target to be used for the contamination resistant fiber sheet 11 in the first embodiment is a board of sintered metal with a ratio of tin and silicon between 2:8-8:2. The pressure within the closed chamber for processing the contamination resistant fiber sheet 11 is lowered to create a vacuum with a pressure of approximately $5\times10^{-5}$ Torr, then inert gas such as argon is introduced into the chamber, making the atmosphere within chamber with the inert gas, such as argon, to approximately $5\times10^{-4}$ Torr, and then oxygen is introduced into the chamber, creating an atmosphere of argon and oxygen mixture at an approximate pressure of $2\times10^{-3}$ Torr. Then between the anode and the target, DC voltage of 500-1000 V is applied to start glow discharge, and the resulting argon ion is collided with the target, and silicon and/or tin expelled, and is oxidized by the oxygen in the atmosphere of the chamber while it is expelled and dispersed, and the resulting $SiO_2$ and/or $SnO_2$ is attached to the front surface of the fiber sheet. As a result, the contamination resistant coating 12 of amorphous structure is created by rapid cooling. Once the contamination resistant coating 12 is formed on the front surface, the fiber sheet 11 is turned over, and the same process is repeated on the back side to form the contamination resistant coating on the back side, consisting of the mixture of $SiO_2$ and $SiO_2$. Also the target may be made of either silicon or tin, and also spattering may be done under the atmosphere consisting only of inert gas and use $SiO_2$ or $SnO_2$ instead. It is desirable to lower the temperature of fiber sheet to below 100° C. by cooling the fiber sheet from the back side using water cooled cylinder or other methods.

The spatter vapor deposit is performed by placing (fixing) the fiber sheet 11 inside one closed chamber, and after fixing the contamination resistant coating 12 onto the front side, the fiber sheet 11 is taken out of the chamber, turned over and placed and fixed back into the closed chamber, and the fiber sheet 11 is removed from the chamber when the contamination resistant coating 12 is fixed on the back side of the sheet, but within the one closed chamber, two vapor depositing mechanisms composed from, a water cooled cylinder, an anode and a target may be placed, while the fiber sheet 11 is spread out and transported within the chamber, using the first vapor depositing mechanism, the contamination resistant coating 12 is fixed on to the front side of the fiber sheet, then followed by the second vapor depositing mechanism fixing the contamination resistant coating 12 onto the back side of the fiber sheet, by having two vapor depositing mechanisms within the chamber, the amount of work (handling) is reduced in half, as the work involved in depressurization of the chamber and placing (fixing) the fiber sheet within the chamber is reduced to half.

The same reduction in time and handling may achieved for fixing the outer coating 13 onto the fiber sheet in the second embodiment of the invention by utilizing a two vapor depositing mechanisms described above.

Figure 3:
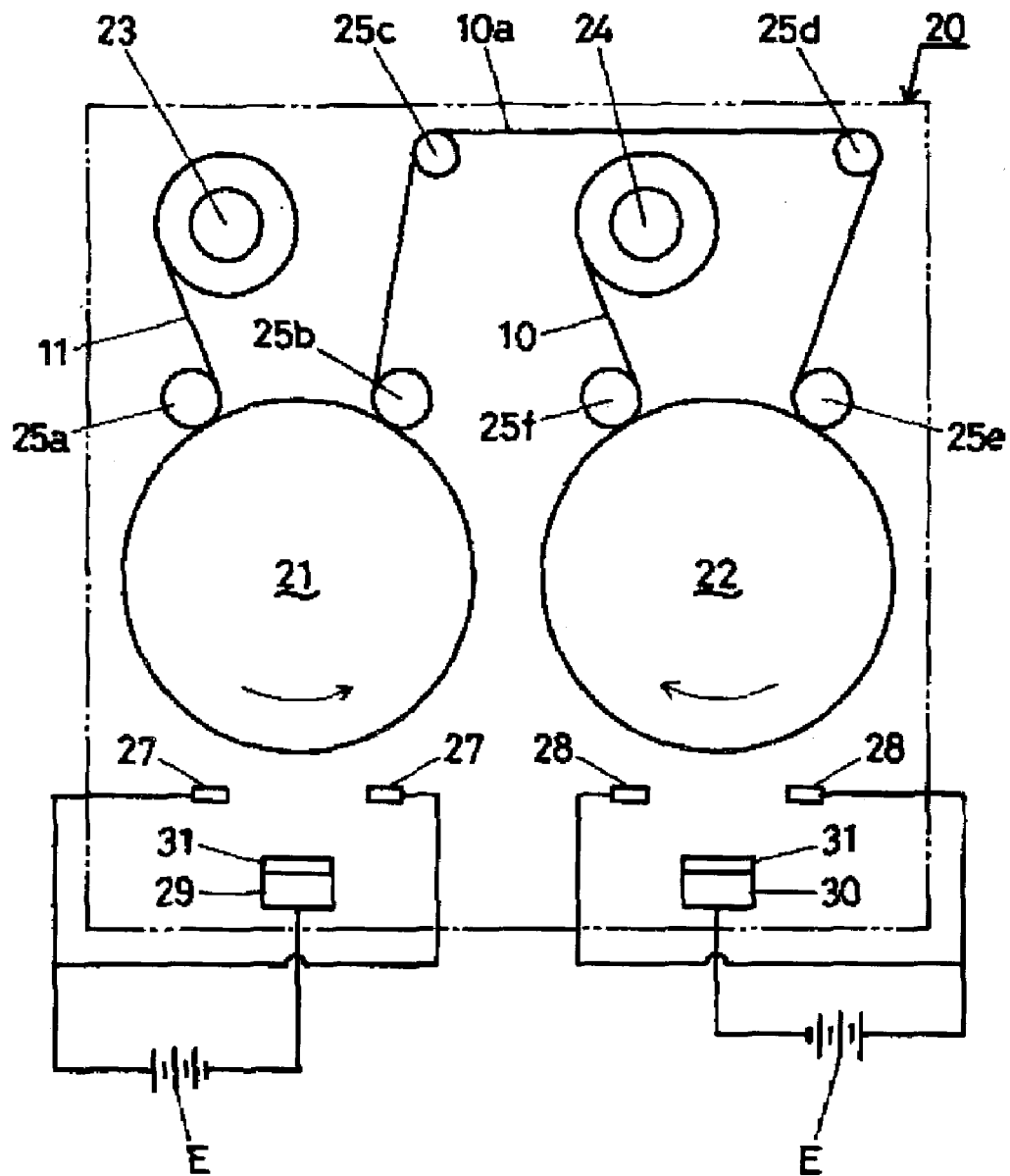
FIG. 3 is a cross sectional view of an example of a sputtering apparatus for use with the present invention.

FIG. 3 shows two vapor deposit mechanism, placed in a parallel manner within a chamber, forming a two-step spatter mechanism. In FIG. 2, the closed chamber 20, and the first water cooled cylinder 21, and the second water cooled cylinder 22 are located to the left and to the right of the center of the chamber, and the first water cooled cylinder 21 located on the left side turns counterclockwise, and the second water cooled cylinder 22 located on the right side turns clockwise.

Above the water cooled cylinder 21 is a feeding shaft 23 which sends in the pre-processed fiber sheet into the chamber, and above the water cooled cylinder 22 is the receiving shaft 24 which winds up the processed contamination resistant fiber sheet 11, in which both shaft mechanisms operate and turn separately from each other. The fiber sheet sent out from the feeding shaft 23 goes through the first guide roller 25a and the back side of the contamination resistant fiber sheet 11 is wound through so the back surface touches the first water cooled cylinder 21 and from the first water cooled cylinder 21 through the second guide roller 25b, the fiber sheet is separated from the cylinder and then transferred through the third guide roller 25c located above, and onto the fourth guide roller 25d, which it is guided above the feeding shaft 23, and is guided through the fifth guide roller 25e located below, the sheet is guided so the front side of the fiber sheet touches the second water cooled cylinder 22 and it is separated from the cylinder by being guided through the sixth guide roller 25f and is wound up by the receiving shaft 24.

Underneath the first water cooled cylinder 21 and the second water cooled cylinder 22 are a pair of anodes, the first anode 27 and the second anode 28. Underneath the first anode 27 and the second anode 28 are first water cooled target source 29 and the second water cooled target source 30, respectively, and fixed above the target sources are the two flat boards (plate) made of silicon or tin or the mixture of the two materials, and the electric voltage of 500-1000 V (the power supply E) is applied to the area between the first anode 27 and first target source 29 and to the area between the second anode 28 and the second target source.

Under the mechanism, the feeding shaft 23, the receiving shaft 24, and the water cooled cylinders 21 and 22, are turned, and from the feeding shaft 23, the fiber sheet 11, is sent into the chamber at a predetermined speed, and the sheet comes into contact first, with the first water cooled cylinder 21, then with the second water cooled cylinder 22, and while winding up the sheet by the receiving shaft 24, the fiber sheet 11 is cooled down from back side of the sheet at the first water cooled cylinder 21 and the sheet is cooled from the front side of the sheet at the second water cooled cylinder. The vacuum pump (not shown in the drawings), which is connected to the closed chamber 20 is turned on to bring down the pressure within the closed chamber 20 to approximately $5 \times 10^{-5}$ Torr for the contamination resistant fiber sheet of the first embodiment and to approximately $1.3 \times 10^{-3}$ Pa for contamination resistant fiber sheet of the second embodiment, and then from a gas tank (not shown in the figure), argon gas is introduced into the chamber, adjusting the pressure within the closed chamber 20 to approximately $5 \times 10^{-4}$ Torr for the first embodiment and to approximately $6.6 \times 10^{-2}$ Pa for the second embodiment, and additionally from an oxygen tank (not shown in the figure), oxygen is introduced into the closed chamber 20 to adjust the pressure within the closed chamber 20 to approximately $1 \times 10^{-3}$ Torr the first embodiment and to $2.6 \times 10^{-1}$ Pa for the second embodiment.

Between the first anode 27 and the first target source 29, DC voltage is applied, and from the flat board target 31, silicon and/or tin, for the contamination resistant fiber sheet of the first embodiment, and silicon for the contamination resistant fiber sheet of the second embodiment, are expelled, and react with the oxygen found within the closed chamber 20 and oxidized, and $SiO_2$ and/or $SnO_2$ for the first embodiment and $SiO_2$ for the second embodiment, are fixed onto the front side of the fiber sheet 11 over the first water cooled cylinder 21 and is cooled rapidly to create a contamination resistant coating 12 (see FIG. 1) for the first embodiment or to create an outer coating for the second embodiment, with an amorphous structure. By adjusting the speed of the fiber sheet 11, guided through the chamber, the contamination resistant coating is formed with a thickness between 1-500 nm for the first embodiment and for the second embodiment, the thickness of the coating is to be between 1~200 nm.

As the spatter vapor deposit at the first water cooled cylinder 21 proceeds as referenced above, an intermediate product 10a composed of the fiber sheet 11, and its front side coated with the contamination resistant coating is transferred and arrives at the second water cooled cylinder 22, and when it arrives at the second water cooled cylinder 22, DC voltage is applied between the second anode 28 and the second target source 30 and from the flat board (plate) target 31, silicon and/or tin is expelled for the first embodiment, and silicon is expelled for the second embodiment, and react with the oxygen found within the closed chamber 20 and become $SiO_2$ and/or $SnO_2$ accordingly and are fixed onto the back side of the fiber sheet 11 in the same manner as it is explained above, and it is cooled rapidly to create the contamination resistant coating 12 (see FIG. 1) with an amorphous structure with a thickness between 1-500 nm for the first embodiment or the outer coating 13, with an amorphous structure with a thickness of 1-200 nm for the second embodiment. When the entire fiber sheet 11 initially wound on the feeding shaft 23 is transferred to the receiving shaft 24, then air is allowed to enter the closed chamber 20 and the fiber sheet 11, with contamination resistant coating 12 fixed on both side of the fiber sheet with a thickness of 1-500 nm is removed in the first embodiment, or the fiber sheet 11 with contamination and oily soiling resistant fiber sheet 12 fixed on both side of the fiber sheet with a thickness of 1-200 nm is removed in the second embodiment.

For processing fiber sheet the second embodiment, the target 27 is described above to be composed only of silicon, but both tin and silicon may be used as the target. The target in this case may have a ratio of silicon and tin of between 9:1~6:4, forming a sintered plate. By spattering as described above, an outer layer 13 with $SiO_2$ as its main component and $SnO_2$ as sub-component is obtained. The fixing of outer layer is more easily done when this mixture is used and the resistant against contamination is also improved. Also by replacing 10~50% of the weight of tin by zinc, and the same spattering process is followed, an outer layer 13 with $SiO_2$ as its main component and $SnO_2$ and $ZnO$ as its subcomponent is obtained which features improved protection from contamination and soiling caused by static electricity.

EXAMPLE 1

Under the condition and method described above, a flat board (plate) target 31 made from silicon and tin mixture, which was sintered into a metal plate was used, with the pressure within the closed chamber 20 adjusted to approximately $1 \times 10^{-3}$ Torr through introduction of gas mixture of oxygen and argon, and the electrical voltage and current, applied between the first anode 27 and the first target source 29 and between the second anode 28 and the second target source 30 was set at 500 V and 50 A, and material for lace curtain refined and formed from polyester multi-filament line (thread) (150 dale/75 filament) (approximate weight 80 g/m$^2$), guided through the chamber at a speed of 0.5 m/second, and spatter vapor deposit was performed on both side of the fiber sheet, forming contamination resistant coating with amorphous structure of $SiO_2$ and $SnO_2$ with a thickness of 5 nm.

The contamination resistant curtain obtained from this process when compared to a curtain without undergoing the process, it was difficult to observe difference in appearance or touch, but when both curtains were hung outdoors for one month, the curtain that went through the process was obvious cleaner to the naked eye. When both curtains were washed, contamination was more easily removed from the curtain with the process, the amount of contamination found on the curtain with the contamination resistant coating was less when compared to the non-processed curtain even after the curtain was washed five times and put through the similar test of placing the curtains outdoor. A commercially sold duct tape was applied to the processed curtain and when the duct tape was removed from the surface of the curtain, there were no observable removal of the contamination resistant coating.

As described above, this invention provides contamination resistant function against contamination, and it makes contamination more difficult from attaching to the fiber sheet as well as makes the removal of contamination easier, and is also very durable. It is also transparent, which allows the design and dye of the fiber sheet viewable and the touch of the fiber sheet with this coating is almost same as the fiber sheet without such coating, making is ideal for application for outdoor and indoor use where contamination is a problem.

While the description above provides a full and complete disclosure of one of the preferred embodiments of the present invention, various modifications, alternate constructions and equivalents may be employed without departing from the true scope and spirit of the invention.

EXAMPLE 2

The spinning thread of No. 30 thickness of polyethylene terephthalate fiber as both and warp 11a and as weft 11b, is used to weave at a density of 80 threads per inch (31.5 per cm), a flat woven sheet (fiber sheet 11). Then using sodium carbonate(2 g/1) and non-ion surfactant (5 g/1, manufactured by Kao K.K. "Score Role 900"), the fiber sheet was refined in a liquid flow dying machine at a liquor ratio of 1:20, 100 degrees C., and for 20 minutes. The fiber sheet was then washed thoroughly with water, dried, and heat set at 180 degrees C. for 60 seconds.

Next, using fluoride water repelling chemical (manufactured by Asahi Glass K.K., "Asahi Guard AG925") solution at concentration of 2%, the fiber sheet was dipped in the solution, mangled, squeezed (70% squeeze ratio), dried, and heat treated at 170 degrees C. for 60 seconds, resulting with the undercoating 12 with a thickness of 0.5 µm fixed on the fiber sheet.

The fiber sheet with the undercoating was then wound onto the feeding shaft 23 of the spattering mechanism of FIG. 3. A sintered plate of silicon and tin at a ratio of 7:3 was used as target 31 and the fiber sheet 11 was vapor deposited after contamination, and after the fiber sheet went through a wash process after it was contaminated. (wave length 517 nm was used to calculation reflection ratio). The oily contamination agent used to contaminate the fiber sheet was composed of 12.5% each of stearic acid, oleic acid, hardened oil and olive oil, 8.5% of cetyl alcohol, 21.5% of solid paraffin, 5.0% of cholesterol, 15.0% of carbon black, and the non-oily contamination agent used to contaminate the fiber sheet composed of 55% clay, 17.0% each of Portland cement and silica, 0.5% of iron (II) oxide, 8.75% of n-decane, and 1.75% of carbon black. The oily contamination agent and the non-oily contamination agent was mixed at a ratio of 3:1.

The following formula was used for the figures presented in chart 1, a-reflection percentage before contamination, b-reflection percentage after contamination, c-reflection percentage after the fiber sheet was washed after contamination.

[Ratio $pf$ soiling and/or contamination=$(a-b)/a \times 100$]
and [Ratio of washing=$(c-b)/(a-b) \times 100$]

TABLE 1

| | | | Reflection % | | | | |
| Example | Under-coating | Outer Coating | Before Contamination | After Contamination | After Washing | Reflection % | Washing % |
| --- | --- | --- | --- | --- | --- | --- | --- |
| COMPARATIVE EXAMPLE 1 | NO | NO | 84.16 | 40.11 | 46.12 | 52.3 | 13.6 |
| COMPARATIVE EXAMPLE 2 | YES | NO | 82.73 | 63.88 | 67.92 | 22.8 | 21.4 |
| COMPARATIVE EXAMPLE 3 | NO | YES | 82.94 | 51.91 | 55.46 | 37.4 | 11.4 |
| EXAMPLE 2 | YES | YES | 82.40 | 64.56 | 70.29 | 21.7 | 32.1 | through the spattering method to form an outer coating on the front and back surface of the fiber sheet with undercoating 11A. The outer coating 13 with a composition ratio of $SiO_2$ and $SnO_2$ of 7:3 and a thickness of 5 nm was fixed on the fiber sheet, obtaining the contamination and oil soiling resistant fiber sheet 10 as an EXAMPLE 2 of the invention.

Comparative Example 1

On the identical flat fiber sheet (fiber sheet 11) used in the EXAMPLE 2 was treated with identical process of refining, washing, drying and heat setting but the process of fixing the undercoating and the outer coating was abbreviated, creating an example with no undercoating or the outer coating found in EXAMPLE 2.

Comparative Example 2

On the identical flat fiber sheet (fiber sheet 11) used in the EXAMPLE 2 was treated with identical process of refining, washing, drying and heat setting but the process to fix the outer coating was abbreviated, creating an example with only the under coating fixed on the fiber sheet.

Comparative Example 3

On the identical flat fiber sheet (fiber sheet 11) used in the EXAMPLE 2 was treated with identical process of refining, washing, drying and heat setting but only the process to fix the under coating was abbreviated, creating an example with only the outer coating with a composition ratio of $SiO_2$ and $SnO_2$ at a 7:3.

The EXAMPLE 2, COMPARATIVE EXAMPLE 1, 2, and 3 were all contaminated, wash processed under same standard (JIL L0844 A-2 standard method (Laundry Rule)), and reflection ratio was measured before contamination, As it is obvious in the TABLE 1, when a mixture of contamination agent and oily soiling contamination agent is mixed and used as the contamination agent, EXAMPLE 2 was most difficult to contaminate and the contamination was most easily removed from this example.

The feel of the fibers to ones hand was identical when the EXAMPLE 2 and COMPARATIVE EXAMPLES 1, 2, and 3 were compared prior to hanging the fiber sheets outdoors for a month. After the examples were left hanging outdoors, they were observed by naked eye. The difference in color and contamination was least obvious with EXAMPLE 2 when compared to COMPARATIVE EXAMPLES 1, 2, and 3. When the fiber sheets were washed using a household washing machine for five cycles, the contamination was also most easily and quickly removed and most amount of contamination removed from the preferred example.

Also right after EXAMPLE 2 was produced, a commercially sold duct tape was placed over the surface of the fiber sheet and then the tape removed, but no removal of the coating was observed.

While the description above provides a full and complete disclosure of the preferred embodiments of the present invention, various modifications, alternate constructions and equivalents may be employed without departing from the scope and spirit of the invention.

What is claimed is:

1. A contamination resistant fiber sheet comprising: a vapor deposited contamination resistant ceramic coating disposed on a front and a back side of the fiber sheet, wherein a breathable, water-repellent undercoating is disposed on the front side of the fiber sheet underneath the contamination resistant coating, wherein the ceramic coating is of sufficient thickness to inhibit adherence of contaminants to the fiber sheet and wherein the coated fiber sheet coating comprises a mixture of $SiO_2$ and $SnO_2$ having a thickness between 1-500 nm and exhibits a tactile feel analogous to an uncoated fiber, and wherein the fiber sheet is used for curtains, tapestry, heavy curtains, flags, wall paper, or shoji paper.

2. The contamination resistant fiber sheet as claimed in claim 1, wherein the contamination resistant ceramic coating has a thickness between 1-200 nm.

3. The contamination resistant fiber sheet as claimed in claim 1, wherein the contamination resistant fiber sheet is hydrophilic.

4. The contamination resistant fiber sheet as claimed in claim 1, wherein the contamination resistant ceramic coating is transparent to allow designs or patterns on the fiber sheet to be viewable.

5. The contamination resistant fiber sheet as claimed in claim 1, wherein the fiber sheet comprises knitted, woven, or non-woven fiber.

6. The contamination resistant fiber sheet as claimed in claim 1, wherein the fiber sheet comprises synthetic fiber material.

7. The contamination resistant fiber sheet as claimed in claim 1, wherein the contamination resistant ceramic coating is applied by vacuum vapor deposit, sputter vapor deposit, ion beam deposit or ion plating.

8. The contamination resistant fiber sheet as claimed in claim 1, wherein the contamination resistant ceramic coating comprises a non-continuous amorphous structure.

9. The contamination resistant fiber sheet as claimed in claim 6, wherein the synthetic fiber material is nylon fiber, polyester fiber, polyacrylonitrile fiber, or aramid fiber.

* * * * *